United States Patent
Wang et al.

(10) Patent No.: US 8,097,924 B2
(45) Date of Patent: Jan. 17, 2012

(54) ULTRA-SHALLOW JUNCTION MOSFET HAVING A HIGH-K GATE DIELECTRIC AND IN-SITU DOPED SELECTIVE EPITAXY SOURCE/DRAIN EXTENSIONS AND A METHOD OF MAKING SAME

(75) Inventors: Chih-Hao Wang, Hsin-Chu (TW); Shang-Chih Chen, Hsin-Chu (TW); Yen-Ping Wang, Taipei (TW); Hsien-Kuang Chiu, Hsinchu (TW); Liang-Gi Yao, Hsinchu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1330 days.

(21) Appl. No.: 10/872,095

(22) Filed: Jun. 18, 2004

(65) Prior Publication Data
US 2005/0093084 A1    May 5, 2005

Related U.S. Application Data

(60) Provisional application No. 60/516,500, filed on Oct. 31, 2003.

(51) Int. Cl.
*H01L 29/76* (2006.01)
*H01L 29/94* (2006.01)

(52) U.S. Cl. .................... 257/408; 257/344; 257/412

(58) Field of Classification Search ............. 257/344, 257/346, 406, 408, 410, 412, 413, 900
See application file for complete search history.

(56) References Cited

U.S. PATENT DOCUMENTS

| | | | |
|---|---|---|---|
| 6,504,214 B1 | 1/2003 | Yu et al. | |
| 6,512,269 B1 | 1/2003 | Bryant et al. | |
| 6,555,879 B1 | 4/2003 | Krivokapic et al. | |
| 6,803,635 B2 * | 10/2004 | Koyama et al. | 257/411 |
| 6,890,808 B2 * | 5/2005 | Chidambarrao et al. | 438/199 |
| 2002/0013032 A1 | 1/2002 | Ang et al. | |
| 2002/0086505 A1 * | 7/2002 | Cheng et al. | 438/581 |
| 2002/0110988 A1 | 8/2002 | Yeh et al. | |

* cited by examiner

*Primary Examiner* — Hung Vu
(74) *Attorney, Agent, or Firm* — Slater & Matsil, LLP

(57) ABSTRACT

A MOSFET includes a gate having a high-k gate dielectric on a substrate and a gate electrode on the gate dielectric. The gate dielectric protrudes beyond the gate electrode. A deep source and drain having shallow extensions are formed on either side of the gate. The deep source and drain are formed by selective in-situ doped epitaxy or by ion implantation and the extensions are formed by selective, in-situ doped epitaxy. The extensions lie beneath the gate in contact with the gate dielectric. The material of the gate dielectric and the amount of its protrusion beyond the gate electrode are selected so that epitaxial procedures and related procedures do not cause bridging between the gate electrode and the source/drain extensions. Methods of fabricating the MOSFET are described.

24 Claims, 6 Drawing Sheets

ULTRA-SHALLOW JUNCTION MOSFET HAVING A HIGH-K GATE DIELECTRIC AND IN-SITU DOPED SELECTIVE EPITAXY SOURCE/DRAIN EXTENSIONS AND A METHOD OF MAKING SAME

This application claims priority to provisional patent application Ser. No. 60/516,500, filed Oct. 31, 2003, and entitled "Ultra-Shallow Junction MOSFET Having a High-k Gate Dielectric and In-Situ Doped Selective Epitaxy Source/Drain Extensions and a Method of Making Same," which application is incorporated herein by reference.

TECHNICAL FIELD

The present invention relates to ultra shallow junction ("USJ") MOSFETs having high-k gate dielectrics and in-situ doped selective epitaxy source/drain extensions. The present invention also relates to methods of fabricating such MOSFETs. More specifically, the present invention relates to MOSFETs of the foregoing description which exhibit improved performance relative to prior art MOSFETs, and to methods by which such MOSFETs may be fabricated.

BACKGROUND

Prior art MOSFETs include a source and a drain formed in an active region of a semiconductor layer (semiconductor-on-insulator or "SOI" format) or of a semiconductor body (bulk format) by implanting appropriate impurities therein. Between the source and the drain resides a so-called channel (or body) region. A gate resides on the semiconductor above the channel region. The gate comprises a gate electrode and a dielectric layer. The gate electrode is spaced from the semiconductor by the gate dielectric layer. Application of appropriate electrical signals to the gate electrode selectively permits or prevents electrical conduction between the source and the drain.

On-going attempts are being made to decrease the size of MOSFETs and/or to increase their speed of operation, while investing them with greater electrical reliability. These attempts have involved such techniques as: forming ultra-shallow junctions while increasing dopant activation so that sheet resistance in the channel region does not increase; using epitaxial techniques to form high-dopant sources and drains and to form high-dopant extensions of the sources and the drains to reduce resistance at the semiconductor-source/drain interfaces; using epitaxial techniques to achieve appropriate compressive or tensile stresses in the channel; and using thin layers of high-k materials, i.e., materials having a dielectric constant (or relative permittivity) greater than about 3.9, as gate dielectrics—instead of typical oxide layers having dielectric constants of about 3.9 or less—to prevent gate tunneling leakage between the gate electrode and the channel region.

Following fabrication of the above-described smaller, faster MOSFETs using epitaxial techniques to form the source and drain and having a thin gate oxide, damage to the gate oxide has been detected. Such damage causes gate-electrode-to-source-extension bridging or gate-electrode-to-drain-extension bridging. It is postulated that such damage is caused by the processes typically effected prior to and during the epitaxial steps carried out to produce the source, the drain and their extensions. Such damage gives rise to excessive gate leakage current and device failure following formation of the selective epitaxy source and drain and/or their extensions.

The present invention eliminates or ameliorates prior art problems related to the fabrication of USJ MOSFETs having in-situ doped selective epitaxy source/drain extensions and high-k gate dielectrics, including problems such as unacceptable gate leakage currents, gate-to-source-extension bridging and gate-to-drain-extension bridging, low dopant activation, and high sheet resistance of the source/drain extensions.

SUMMARY OF THE INVENTION

The present invention contemplates a semiconductor device, such as a MOSFET, preferably a USJ MOSFET, having a high-k gate dielectric, a source and a drain, and extensions thereof formed by in-situ doped selective epitaxy techniques. Preferably, the source and the drain are deep, while the extensions are shallow. The present invention also contemplates a method of fabricating such a MOSFET which eliminates or ameliorates leakage currents between the gate electrode and the source/drain extensions caused by pre-epitaxy and/or epitaxy procedures.

In accordance with a preferred embodiment of the present invention, a MOSFET is provided. The MOSFET comprises a semiconductor substrate and a gate on a free surface of the substrate. The gate includes a gate dielectric, which comprises a layer of a high-k material on the free surface of the substrate, and a gate electrode on the free surface of the high-k layer. The high-k layer protrudes beyond the gate electrode. The MOSFET also comprises a source and a drain formed on opposite sides of the gate and a shallow source extension and a shallow drain extension, each formed by selective in-situ doped epitaxy.

In accordance with another preferred embodiment of the present invention, a MOSFET is provided. The MOSFET comprises a semiconductor substrate and a gate on a free surface of the substrate. The gate includes a gate dielectric, which comprises a layer of high-k material on the free surface of the substrate, and a gate electrode on the free surface of the high-k layer. The high-k layer protrudes beyond the gate electrode and is capable of acting as a protective barrier against damage during etching, cleaning, HF dip, epitaxial procedures, or epitaxial-related procedures. The MOSFET also comprises a source and a drain formed on opposite sides of the gate, and a shallow source extension and a shallow drain extension formed by selective in-situ doped epitaxy.

In accordance with another preferred embodiment of the present invention, a method for making a MOSFET is provided. First, a high-k dielectric layer is formed on a semiconductor substrate and a conductive layer is formed on the dielectric layer. Second, the layers are patterned to form a gate having a gate electrode atop a gate dielectric. The footprint of the gate dielectric is larger than the footprint of the gate electrode so that the gate dielectric protrudes beyond the gate electrode. Next, a first spacer is formed on the sides of the gate, on the free surface of the protruding gate dielectric, and on the substrate to a selected distance away from the gate. Then, portions of the substrate not covered by the spacer are etched to form first deep recesses in the substrate. Next, a deep source and a deep drain are formed in respective first recesses by selective in-situ doped epitaxy. Then, the first spacer is removed and a second spacer is formed on the sides of the gate and on the free surface of the protruding gate dielectric. Thereafter, the free surfaces of the source, the drain and the substrate and the upper surface of the substrate beneath the gate dielectric are etched to produce second shallow recesses therein. Finally, shallow source and drain extensions are formed in respective second recesses by selective in-situ doped epitaxy so that termini of the shallow extensions lie beneath and in contact with the gate dielectric.

In accordance with another preferred embodiment of the present invention, a method for making a MOSFET is provided. First, a high-k dielectric layer is deposited on a semiconductor substrate and a conductive layer is deposited on the dielectric layer. Second, the layers are patterned to form a gate having a gate electrode atop a gate dielectric. The footprint of the gate dielectric is larger than the footprint of the gate electrode so that the gate dielectric protrudes beyond the gate electrode. Next, a first spacer is formed on the sides of the gate and on the free surface of the protruding gate dielectric, and then the free surface of the substrate and the upper surface of the substrate beneath the gate dielectric are etched to form first shallow recesses in the substrate. Then, shallow source and drain extensions are formed in respective first recesses by selective in-situ doped epitaxy. The first spacer is then removed and a second spacer is formed on the sides of the gate, on the free surface of the protruding gate dielectric, and on the extensions to a selected distance away from the gate. Finally, a deep source and a deep drain are formed in the substrate where the substrate is not covered by the second spacer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
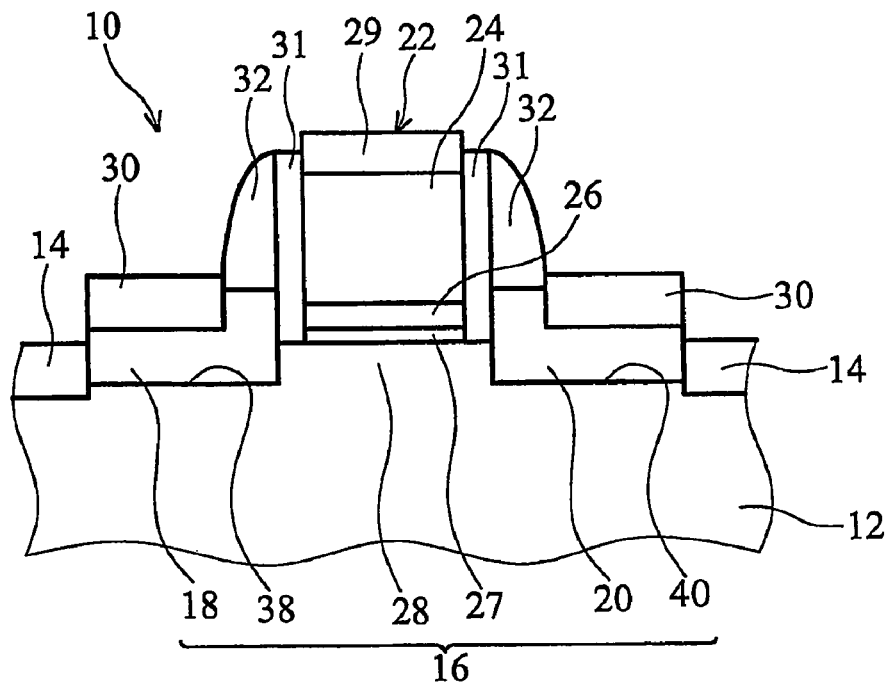
FIG. 1 is a sectioned view of a prior art MOSFET, which is based on FIG. 1 of U.S. Pat. No. 6,504,214 and is generally of the type improved by the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In its product embodiments, a MOSFET has a semiconductor substrate, such substrate including both a semiconductor layer on an insulative substrate ("SOI") and a semiconductor body ("bulk"). The term "MOSFET" will be understood by those skilled in the art to include single or multiple transistors, memory cells, and other semiconductor devices, as well as both NMOS and PMOS devices. The substrate may comprise any suitable semiconductor including (typically) silicon, silicon-germanium, silicon-carbon and germanium.

An active region of the substrate is defined between a source and a drain separated by a gate formed on an upper surface of the substrate. The channel region resides in the substrate between the source and the drain. The gate comprises a relatively thin dielectric film or layer of high-k material on the upper or free surface of the substrate and a gate electrode on the upper or free surface of the dielectric layer. The gate electrode may be a metal (including copper, gold, silver, tungsten, tantalum, aluminum, nickel, ruthenium, rhodium, palladium, platinum, titanium, or molybdenum), a metallic compound (such as appropriate nitrides like titanium nitride or tantalum nitride), or a metallic silicide. The gate electrode may also be a conductive material, such as polycrystalline silicon or polycrystalline silicon-germanium.

The high-k material has a dielectric constant (relative permittivity) higher than 3.9 and is capable of acting as a protective and etching barrier. As used herein, the ability of the relatively thin high-k material to act as a protective and etching barrier means that it is resistant to the erosive and other deleterious effects of epitaxy and/or pre-epitaxy procedures, such as the epitaxy procedures themselves such as cleaning (including HF application), etching, and other procedures that are typically effected during and/or prior to epitaxial formation of the deep source and drain and their shallow extensions.

Exemplars of appropriate and preferred high-k materials include the following: metal oxides, metal nitrides, metal silicates, transition metal oxides, transition metal nitrides, transition metal silicates, oxynitrides of metals, metal aluminates, zirconium silicate, zirconium aluminate, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof. It is thought that because many other inorganic high-k materials are resistant to etching by current etching formulations, they are candidates for use as gate dielectrics, which resist damage during selective epitaxy procedures and prevent gate-electrode-to-source/drain-extension bridging.

The high-k film or layer has a lateral extent or "footprint" larger than that of the gate electrode. That is, portions of the high-k film or layer protrude or extend beyond the periphery or sides of the gate electrode along the upper, free surface of the substrate. Stated differently, the footprint of the high-k layer as viewed from above or below (i.e., perpendicular to the plane of the high-k layer and the substrate) is larger than that of the gate electrode.

In preferred embodiments, the deep source and drain are formed by selective in-situ doped epitaxy procedures suitable for use in fabricating USJ devices, as will be understood by those skilled in the art. Alternatively, the deep source/drain may be formed by ion implantation. Where epitaxy is used, recesses are first formed in the substrate for the subsequent in-situ epitaxial formation therein of the appropriately doped deep source and drain. In some embodiments the preferred composition of the deep source and drain includes silicon, silicon-germanium, silicon-carbon, or a compound semiconductor, such as a I-VII compound, a II-VI compound, a III-V compound or a IV-IV compound. The foregoing materials may be used to form the deep source and drain so as to effect selected compressive or tensile stresses in the channel region of the substrate, as will be understood by the art worker of ordinary skill.

Formed by selective in-situ doped epitaxy of the same materials as the deep source and drain are respective shallow contiguous extensions thereof which lie between the source and the drain beneath the protruding or extending superjacent portions of the gate dielectric. The free or upper surfaces of the extensions are in contact with the lower surface of the protruding portions of the gate dielectric. Preferably, the shallow source and drain extensions extend inwardly beyond the periphery of the protruding gate dielectric portions and underlie peripheral portions of the gate electrode. The amount of overlap (as viewed normal to the substrate) between the gate electrode and the underlying portions is selected to achieve a desired overlay capacitance and series channel resistance. The channel region, accordingly, resides between the lower, deep source and drain as, well as between and below the higher, shallow extensions of the source and the drain.

In some embodiments, the upper, free surfaces of the source and drain are generally coplanar with the upper surface of the substrate. In other embodiments, the source and drain may be raised or elevated so that the upper, free surfaces of the source and drain are elevated above the upper surface of the substrate. In some embodiments, the source, the drain and their respective extensions are comprised of the same materials, while in other embodiments the composition of the source/drain and their extensions may differ.

In its method aspects, the present invention contemplates methods for fabricating MOSFETs having the structures described above.

Referring first to FIG. 1, there is shown a MOSFET 10 according to the prior art, as generally set forth in U.S. Pat. No. 6,504,214 ("the '214 patent"). In FIG. 1, taken from FIG. 1 of the '214 patent, the MOSFET or other semiconductor device 10 is fabricated in and on a substrate 12. The device 10 may be a MOSFET used in the manufacture of a CMOS or other type of integrated circuit. The device 10 may also take the form of another type of transistor, a memory cell, or another type of semiconductor device. Multiple devices 10, including NMOS and/or PMOS devices 10, can be formed on the substrate 12 separated by isolation regions 14.

The device 10 includes an active region 16 of the substrate 12. The substrate 12 may, as shown, be of the bulk type and comprise a body of silicon, silicon-germanium, germanium or other semiconductor. If an SOI structure is to be fabricated, the substrate 12 may constitute a semiconductor film of silicon, silicon-germanium, germanium, or other semiconductor material formed on a layer (not shown) of insulating material, such as a buried oxide ("BOX"). In this latter event, the insulating layer is formed on a semiconductor "handle wafer" (not shown).

The active region 16 includes a deep source 18, a deep drain 20 and a gate 22 between the source 18 and the drain 20. The deep source and drain 18, 20 are formed by in-situ doped selective low temperature epitaxy techniques with their upper portions elevated above the plane of the substrate 12.

The gate 22 includes a gate electrode 24 on a relatively thick, high-k gate dielectric 26 that separates the gate electrode 24 from the substrate 12. As shown in the '214 patent, the gate dielectric 26 may rest on an intervening buffer interface 27, which, in turn, rests on the substrate 12. According to the '214 patent, the gate dielectric 26 and the buffer interface 27 (if present) "are patterned to be coextensive with the gate electrode" 24 (column 6, lines 29-32). This is achieved by "removing a portion of the layer [26] of high-k dielectric material extending laterally beyond the gate electrode [24]," (column 1, lines 6-64).

A channel 28 between the source 18 and the drain 20 is defined within the substrate 12. The conductivity of the channel 28 is controlled by electrical signals applied to the gate electrode 24. The gate electrode 24 may be a metal, such as tungsten, tantalum, aluminum, nickel, ruthenium, rhodium, palladium, platinum, titanium, and molybdenum; a metal-containing compound, such as titanium nitride or tantalum nitride; a semiconductor, such as polycrystalline silicon or polycrystalline silicon-germanium; or a silicide. If the gate electrode 24 is a semiconductor, a conductive gate contact 29 may be formed thereon by siliciding the free surface of the electrode 24. Conductive contacts 30 for the source 18 and the drain 20 may be similarly formed.

In the '214 patent, the function of the buffer interface 27 between the gate dielectric 26 and the substrate 12 is said to be as (a) a reducer of diffusion and/or penetration of atoms from the high-k gate dielectric 26 into the substrate 12 and (b) a retarder of a reaction of the high-k material of the gate dielectric 26 with the substrate 12, either or both possibly leading to degradation of channel mobility in the channel 28.

The gate dielectric 26 is a high-k material or multi-layered stack of high-k materials. As used in the '214 patent, "high-k" means that the material of the gate dielectric 26 has a relative permittivity or dielectric constant higher than 10. The '214 patent expresses a preference for the following high-k materials: metal oxides, metal nitrides, metal silicates, transition metal oxides, transition metal nitrides, transition metal silicates, oxynitrides of metals, metal aluminates, zirconium silicate, zirconium aluminate, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_y$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof, all having a k higher than 10. The '214 patent also contemplates that the gate dielectric 26 may be a "standard-k" material with a k less than 10, such as silicon oxide, silicon oxynitride, and silicon nitride.

In the '214 patent, a preference is expressed for high-k gate dielectrics 26 because they minimize performance-degrading effects such as current leakage between the source/drain 18/20 and the gate electrode 24, allow for the establishment of a suitable capacitance, and otherwise improve the reliability of the device 10.

A liner 31 is formed adjacent the sidewall of the gate 22 as an aid in the fabrication of the device 10 by isolating the gate 22 from the source 18 and the drain 20 during fabrication. The liner 31 may be relatively thick silicon oxide or another oxide.

Sidewall spacers 32 on the liner 31 define the locations between the spacers 32 and the isolation regions 14 where the source 18 and the drain 20 will be formed by epitaxy. The spacers 32 may be an oxide, such as silicon oxide; a nitride, such as silicon nitride; or a composite spacer, such as oxide/nitride, nitride/oxide, oxide/nitride/oxide, or nitride/oxide/nitride.

The deep source 18 and the deep drain 20 are located in respective recesses 38 and 40 formed in the substrate 12 by selective etching between the liner-spacer 31-32 and the isolation regions 14. Preferably, the source 18 and the drain 20 are formed within their respective recesses 38 and 40 by low temperature selective epitaxy of silicon or silicon-germanium effected between the isolation regions 14 and the liner-spacers 31-32. Appropriate dopant species (N- or P-type) may be introduced into the source 18 and the drain 20 by conventional techniques. Typical N-type dopants include antimony, phosphorous and arsenic. Typical P-type dopants include boron, gallium and indium.

A device somewhat similar to that of the '214 patent is shown and described in U.S. Pat. No. 6,512,269 ("the '269 patent"). The device of the '269 patent includes a gate dielectric of a relatively thick layer of standard-k material. A deep source and a deep drain have respective shallow extensions, the free surfaces thereof being co-planar with a substrate. The deep source and drain and their shallow extensions are formed using ion implantation, not low temperature epitaxial, techniques. The shallow extensions are shown as extending beneath the gate dielectric, which is laterally co-extensive with the gate electrode.

Another device having source/drain extensions beneath a gate dielectric of a gate is shown and described in U.S. Pat. No. 6,555,879 ("the '879 patent"). The gate dielectric of the '879 patent's device is a relatively thick standard-k material, which extends beyond the periphery of the gate electrode. However, the source, the drain, and their respective extensions do not reside in recesses in the substrate, as they are formed by siliciding the substrate, and not by low temperature, in-situ doped selective epitaxy. The free surfaces of the source/drain are not co-planar with the substrate.

Figure 2:
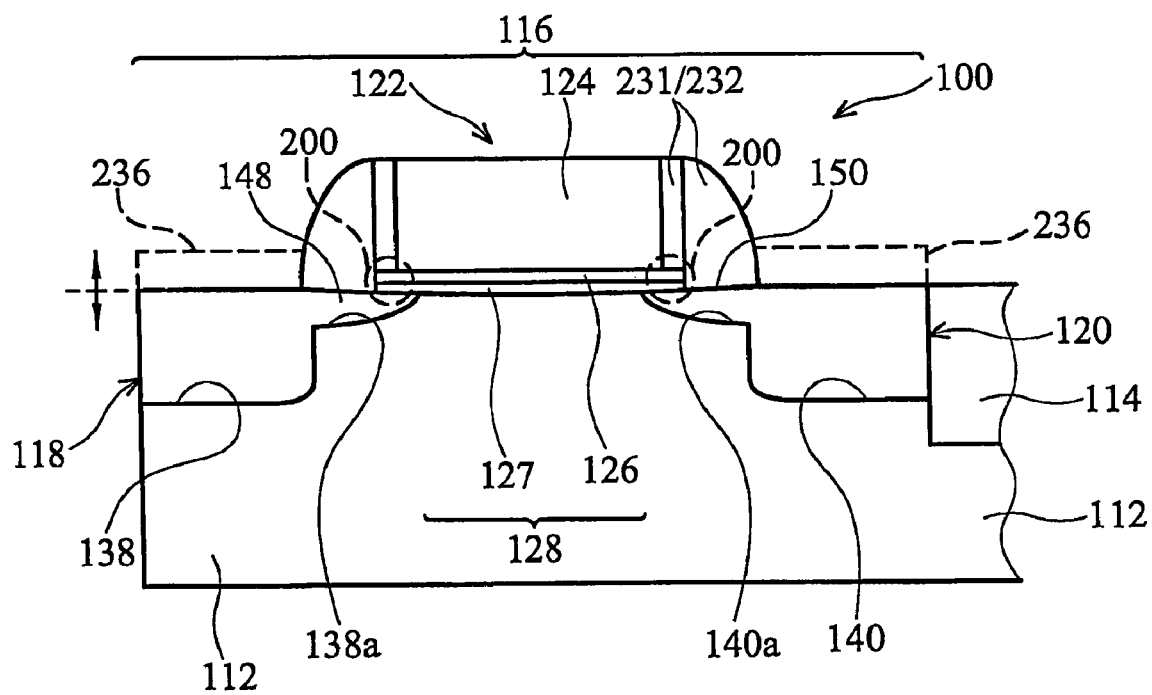
FIG. 2 is a sectioned view of a MOSFET according to the present invention.
Figure 3:
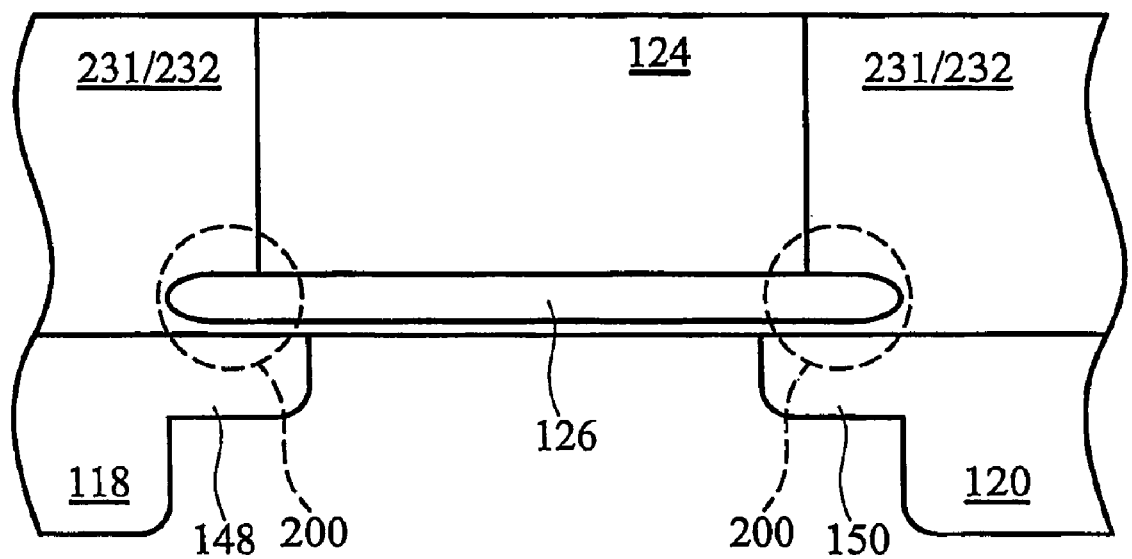
FIG. 3 is a magnified view of portions of the MOSFET in FIG. 1 illustrating its improved structure according to the present invention.

A device, such as a MOSFET 100, according to the present invention is shown in FIGS. 2 and 3. Elements of the MOSFET 100 corresponding to those of the device 10 in FIG. 1 are designated by a three digit reference numeral, the first digit of which is "1" or "2" and the last two digits of which are the same as or similar to the corresponding FIG. 1 element.

Peripheral portions 200 of a high-k gate dielectric 126 extend or protrude outwardly or laterally away from and beyond a gate electrode 124 of a gate 122. As will be described in more detail below, this structure (the high-k gate dielectric and its extending portions 200) is highly etch-resistant and prevents damage during various process steps, such as pre-epitaxy cleaning and HF treatment (oxide removal), selective etching, and epitaxial processes. This protective function of the extending portions 200 of the gate dielectric 126 ameliorates or prevents gate-electrode-to-source-extension 124-to-148 bridging and gate-electrode-to-drain-extension 124-to-150 bridging and consequent leakage currents. The extending portions 200 of the gate dielectric 126 thus act as a protective barrier, particularly between the lower edge of the gate electrode 126 and the proximate portions of source and drain upper extensions 148 and 150, during processing and fabrication of the device 100.

The liner-spacer 31-32 of the '214 patent used to define the site of the recesses 38 and 40 and the deposition site of the source 18 and the drain 20 is replaced by an initial, temporary liner-spacer 131-132 (FIG. 4), which is removed following epitaxial formation of the deep source 118 and the deep drain 120. Prior to epitaxial formation of the source/drain extensions 148/150, a permanent liner-spacer 231 is formed on the sides of the gate 122 and on the upper free surface of the protruding portions 200 of the gate dielectric 126 that extend beyond the gate 122. In other words, in the present invention, the temporary liner-spacer 131-132 is disposable. Its removal, followed by the formation of the permanent liner-spacer 231, exposes an upper free surface of the substrate 112 and the deep source/drain 118/120 to etching and the epitaxial deposition of the extensions 148 and 150. The permanent liner-spacer 231 defines the region wherein there will occur the etching of undercuts 138a and 140a, that is, recesses in the substrate 112 under the gate dielectric 126, for the formation therein by in-situ doped epitaxial deposition of the extensions 148 and 150, as described in more detail below. As noted above, the protruding extension 200 of the gate dielectric 126 prevents bridging between the gate electrode 126 and the extensions 148 and 150. The extensions 148 and 150 not only extend under the protruding portions 200 of the gate dielectric 126 but also extend partially beneath the gate electrode 124.

Because in preferred embodiments epitaxial procedures are used to form the source/drain 118/120 and their extensions 148/150, the structure and method of the present invention permit selective tensile and compressive stressing of the channel 128, as is known.

Referring now to FIGS. 4A-4I, a preferred method of fabricating the device 100 of FIGS. 2 and 3 is described and the steps of such method are illustrated.

Figure 4A:
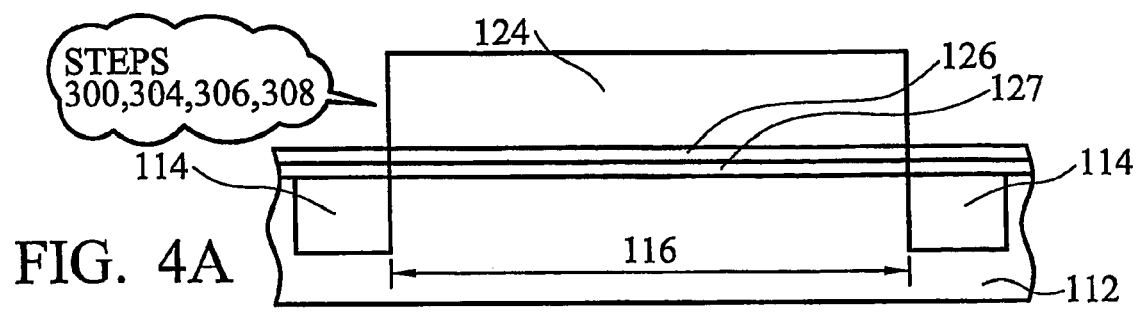
FIGS. 4A-4I illustrate the steps of a process for fabricating the MOSFET of FIGS. 2 and 3, the Figures including a series of sectioned views of the MOSFET depicted in FIGS. 2 and 3 during the various steps of its fabrication.
Figure 4B:
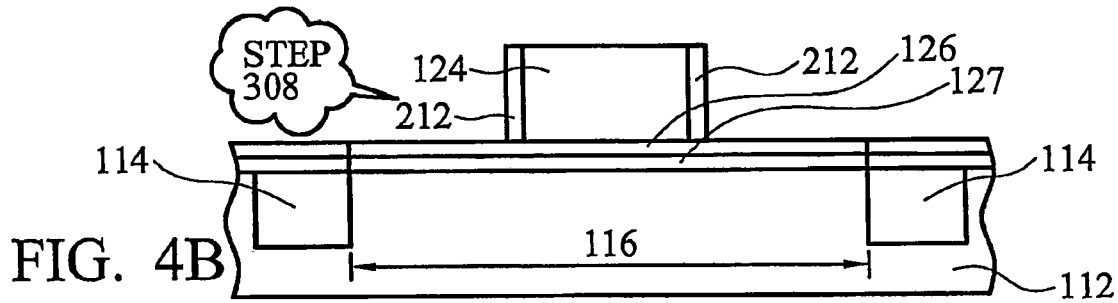
Figure 4C:
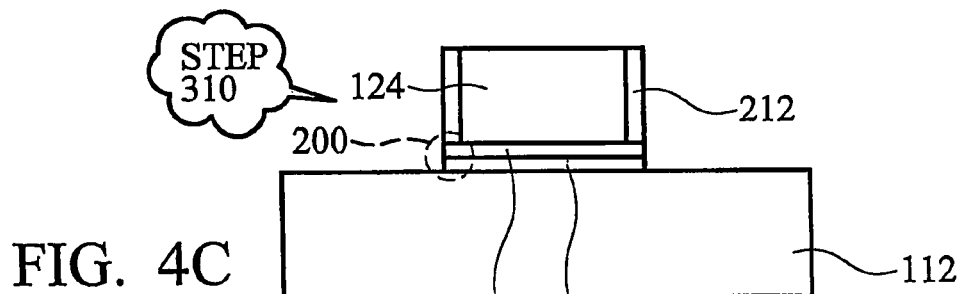

As shown in FIG. 4A, in step 300, the semiconductor substrate 112 is provided. If desired, the substrate 112 can be doped with N- or P-type dopants in a conventional manner. Next, the isolation regions 114 may be formed according to prior art techniques, step 304, to determine one boundary of one or more active regions 116. Preferably, shallow trench isolation ("STI") or other conventional techniques may be used to form the isolation regions 114.

A layer of the high-k material of the gate dielectric 126, which may reside atop a buffer interface layer 127, is then deposited on the upper, free surface of the substrate 112, step 306. In step 308, shown in FIG. 4B, the gate electrode 124 is formed by depositing a layer of an appropriate material on the layer 126 of the high-k material and then patterning, as by the use of a mask or patterned photoresist and a wet or dry chemical etch. In step 310 (FIG. 4C), the dielectric layer is patterned so as to produce the gate dielectric 126 and the protruding portions 200 thereof extending beyond the gate electrode 126. The foregoing step may be effected by first covering the sides of the gate electrode 124 with an etch-resistant liner 212 having a thickness equal or nearly equal to the amount that the gate dielectric 126 will extend or protrude beyond the gate electrode 126 and then etching the dielectric layer.

Figure 4D:
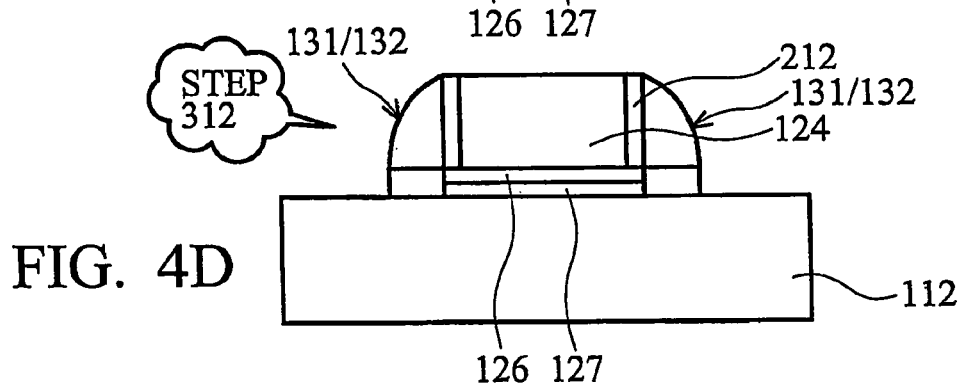
Figure 4E:
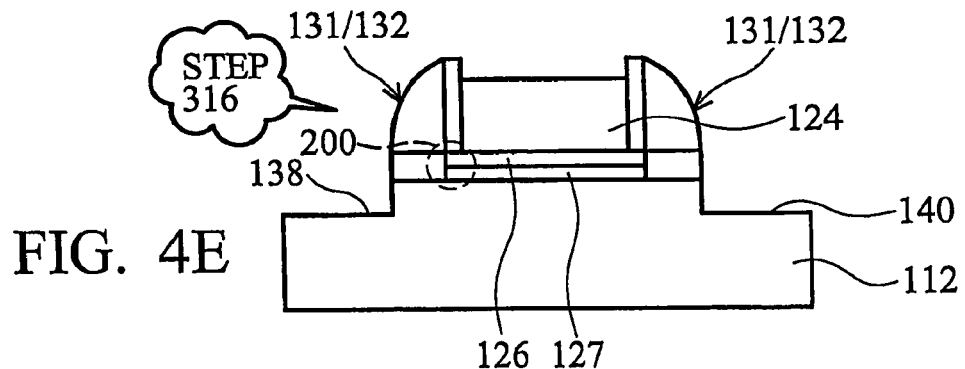
Figure 4F:
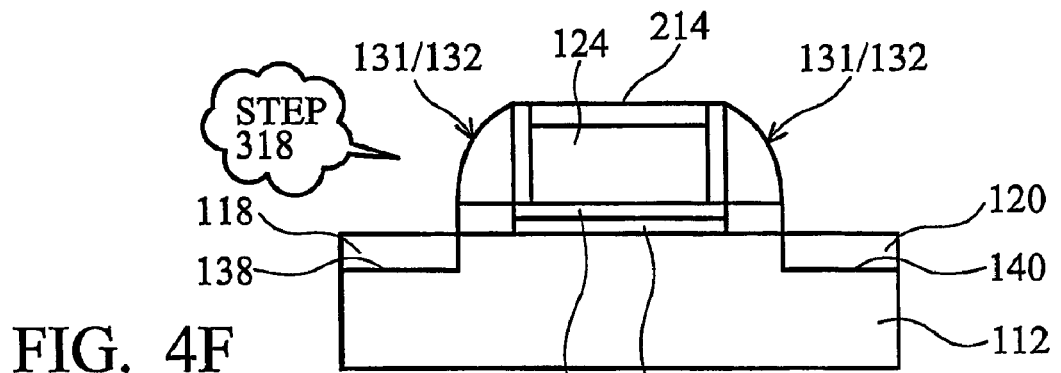
Figure 4G:
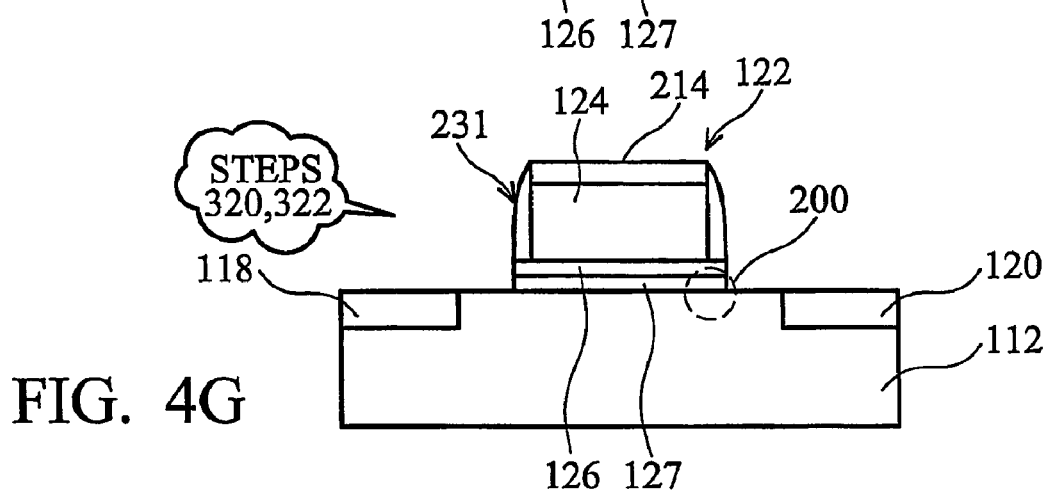

In FIG. 4D, step 312, the temporary liner-spacer 131-132 is formed, such as by conventional deposit-and-etch techniques, from a suitable material, for example silicon oxide, nitride or a functionally similar material. The temporary liner-spacer 131-132 may include the liner 212 used to form the gate dielectric 126 or may be formed after removal of the liner 212. In any event, the liner-spacer 131-132 resides on the sides of the gate electrode 124 and covers the protruding portions 200 of the gate dielectric 126. The liner 212 shown in step 312 is "optional" as it may be removed and replaced by a segment of the temporary liner-spacer 131-132, as seen in step 316 (FIG. 4E).

In step 316, portions of the substrate 112 between the temporary liner-spacer 130-132 and the isolation regions 114 are removed to produce the respective recesses 138 and 140 for the source 118 and the drain 120. This may be achieved by the use of a suitable etchant, which may also remove an upper portion of the gate electrode 124 so that it is slightly recessed below the upper plane defined by the temporary liner-spacer 131-132. Next, in step 318 (FIG. 4F), the source 118 and the drain 120 are formed in their respective recesses 138 and 140. In preferred embodiments, the source 118 and the drain 120 are formed by low temperature selective epitaxial deposition of suitable material, such as Si, SiGe or SiC, or a compound semiconductor with the source/drain 118/120 being doped in-situ as they are deposited with appropriate dopant species. At the same time, an epitaxial layer 214 may also be formed on the free surface of the gate electrode 124. In step 320 (FIG.

4G), the temporary liner-spacer 131-132 is removed, following which, in step 322, a permanent liner-spacer 231 is formed on the sides of the gate electrode 124. The permanent liner-spacer 231 and the layer 214 protect the gate electrode 124 from the effects of subsequent steps. The permanent liner-spacer 231 overlies the previously formed protruding extensions 200 of the gate dielectric 126.

Figure 4H:
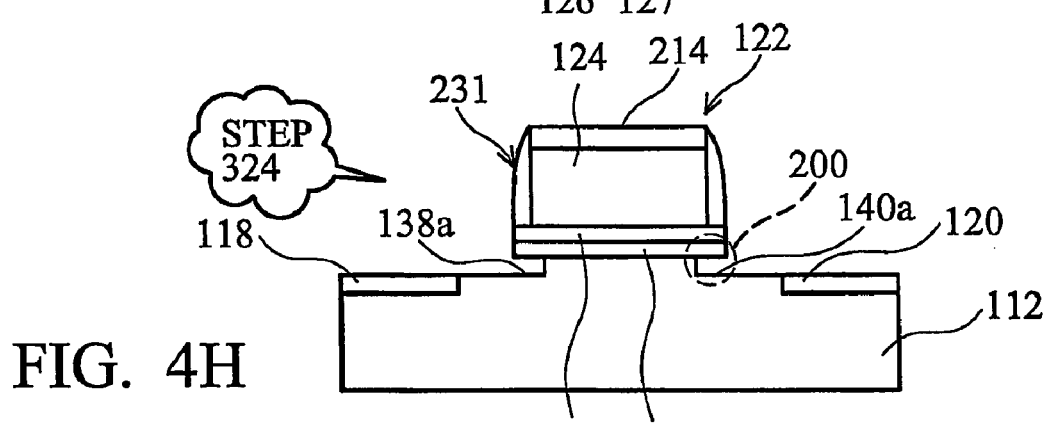
Figure 4I:
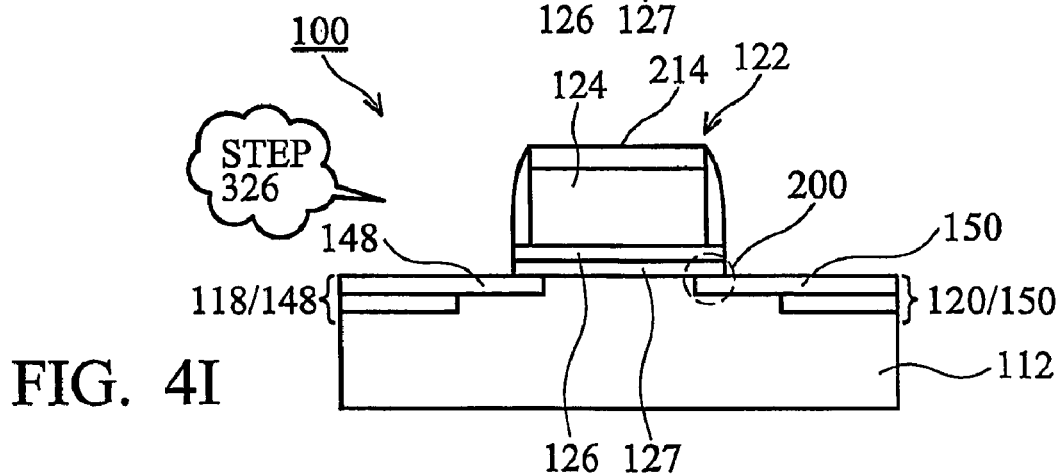
Figure 5A:
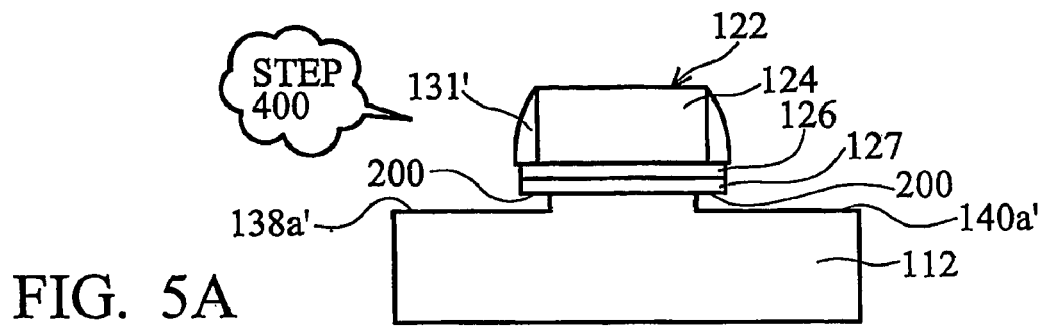
FIGS. 5A-5F illustrate the steps of two alternative processes to that depicted in FIG. 4 for fabricating the MOSFET of FIGS. 2 and 3, including a series of sectioned views of the MOSFET during its fabrication.
Figure 5B:
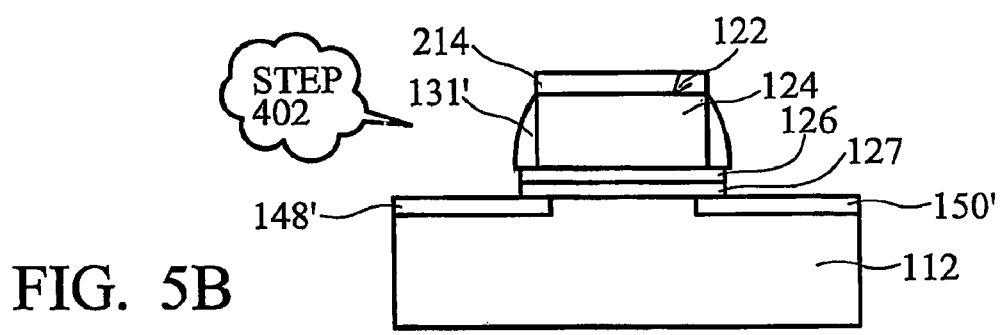
Figure 5C:
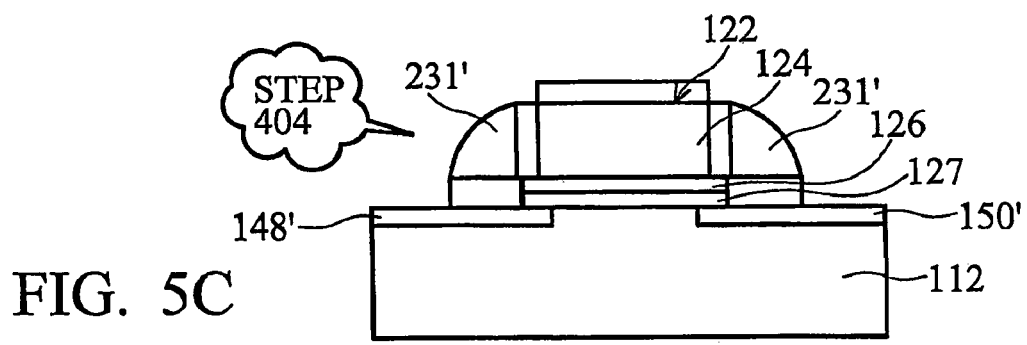
Figure 5D:
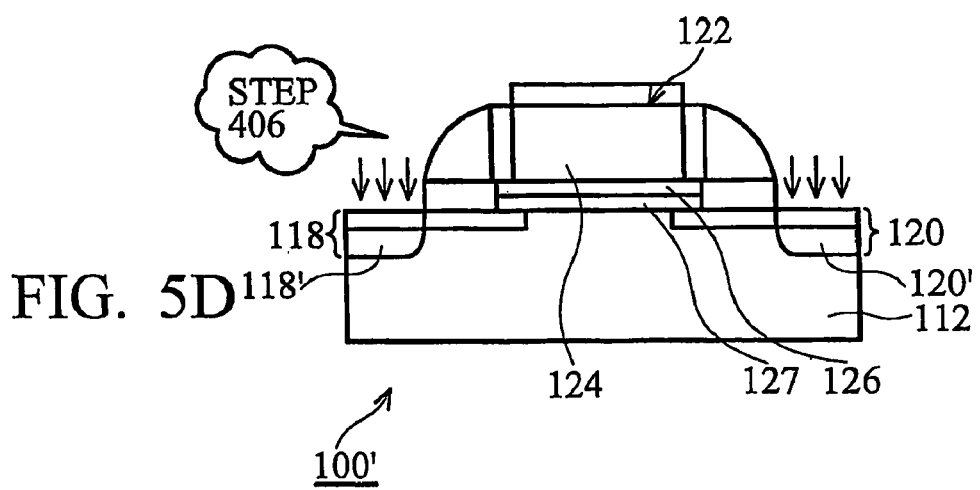
Figure 5E:
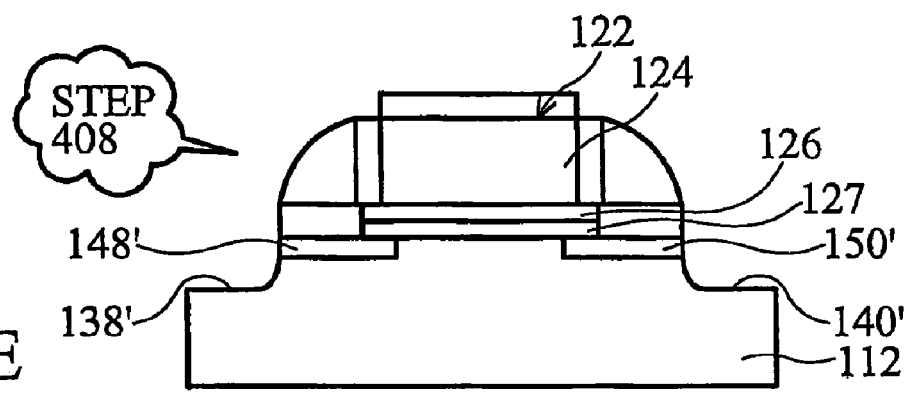
Figure 5F:
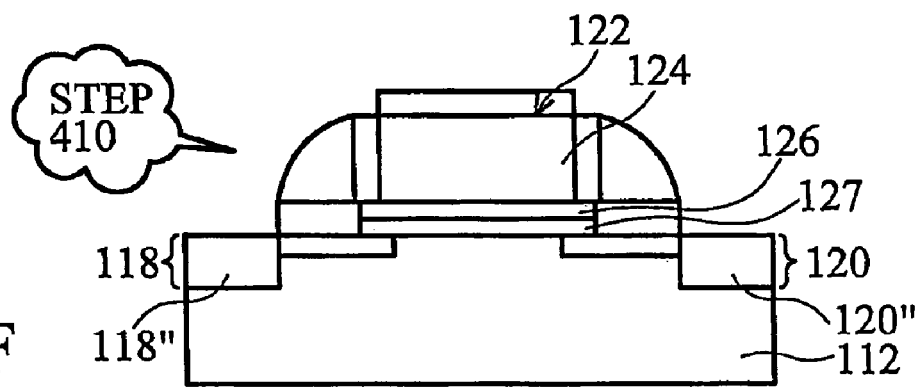

Next, as shown in FIG. 4H, selective etching of the free surfaces of the source/drain 118/120 and the substrate 112 removes portions thereof, step 324. This etching is effected so as to thin the source/drain 118/120 and to undercut the substrate 112 so that recesses 138a and 138b for the extensions 148 and 150 are formed between the substrate 112 and the protruding portions 200 of the gate dielectric 126. Last, the same or similar selective in-situ doped epitaxy steps used to form the source/drain 118/120 are effected to form the extensions 148 and 150 in the recesses 138a and 140a and over the source 118 and drain 120, step 326 (FIG. 4I). Thus, the source 118/148 and the drain 120/150 may be viewed as constituting respective lower portions 118 and 120 and respective upper portions or extensions 148 and 150. It is contemplated that the deep source 118 and the deep drain 120 may comprise the same or different materials. Moreover, the shallow extensions 148 and 150 may comprise the same or different materials as comprise the lower deep portions 118 and 120.

In FIGS. 2 and 4, the free surfaces of the source and drain structures 118,148 and 120,150 are depicted as being coplanar with that of the substrate 112. This configuration may be referred to as a "non-raised" configuration. As will be appreciated by those skilled in the art, the extensions 148 and 150 may be formed so that these free surfaces are elevated above that of the substrate 112, as indicated by the dashed lines 236 in FIG. 2. This latter configuration may be referred to as a "raised" configuration.

It has been found that devices having the protruding extensions 200 of the gate dielectric 126 prevent leakage currents and bridging between the gate electrode 124 and the source/drain extensions 148/150. Accordingly, the presence of the protruding extensions 200 has been found to ameliorate the short channel effect and to increase the reliability and robustness of MOSFETs having epitaxially formed extensions 148 and 150. It is theorized that the extensions 200 protect the geometry between the lower edge of the gate electrode 124 and the extensions 148 and 150 by resisting and protecting against the deleterious effects on this geometry of the etching procedures used to produce the recesses 138a and 138b and the effects of the epitaxy procedures used to produce the extensions 148 and 150. This protection has been found to result in no bridging from the gate electrode 124 to the source/drain extensions 148/150 and low leakage currents in completed MOSFETs having oxide-based gate dielectrics. It is theorized that prior art techniques using only a liner/spacer 30/32 on the sides of the gate 22 and not having the protruding portions 200 permit etching and/or epitaxy procedures to attack the edges of the gate dielectric 26, ultimately resulting in lowered electrical resistance and elevated leakage current.

FIGS. 5A-5F depict two alternatives to steps 312-326 of FIGS. 4A-4I for fabricating MOSFETs 100' and 100" similar to the MOSFET of FIGS. 2 and 3.

In step 400 (FIG. 5A) the high-k gate dielectric 126, including the buffer interface 127, if used, and the gate electrode 124 have been formed by deposition and patterning so that the footprint of the former is larger than that of the latter, and the extensions 200 of the dielectric 126 protrude beyond the periphery of the electrode 124. A temporary liner-spacer 131' has been formed to cover the sides of the gate electrode 124 and the upper free surface of the protruding portion 200.

Shallow recesses 138a' and 140a' are formed by etching the substrate 112. Etching is performed so that the substrate 112 is undercut and the recesses 138a' and 140a' extend beneath the protruding extensions 200 of the dielectric 126 and extend a selected distance beneath the gate electrode 124. The temporary liner-spacer 131' and the protruding extensions 200 of the gate dielectric 126 mask the gate electrode 124 during etching.

In step 402 (FIG. 5B), selective, in-situ epitaxy is employed to form shallow extensions 148' and 150' in the recesses 138a' and 140a' so that the shallow extensions 148'/150' underlie the protruding portion 200 and the periphery of the gate electrode 124. This epitaxial deposition also forms the etch stop 214 on the free surface of the gate electrode 124. Between steps 402 and 404, the temporary liner-spacer 131' is removed, and in step 404 (FIG. 5C) a permanent liner-spacer 231' is formed to cover the sides of the electrode 124, the protruding extensions 200 of the gate dielectric 126, and a selected area of the shallow extensions 148' and 150' and the underlying substrate 112.

In step 406 (FIG. 5D), deep source and drain portions 118' and 120' are, as shown by the arrow-headed vertical lines, formed by ion implantation into the shallow extensions 148' and 150' and the underlying substrate 112, thus yielding the MOSFET 100'. The permanent liner-spacer 231' defines and limits the extent of these portions 118' and 120' toward the gate 122.

Steps 408 (FIG. 5E) and 410 (FIG. 5F) are alternatives to step 406. In step 408, deep recesses 138' and 140' are formed through the segments of the shallow extensions 148' and 150' not masked by the permanent liner-spacer 231' and into the substrate 112. Finally, in step 410, deep source and drain portions 118" and 120" are formed in the recesses 138' and 140' by selective, in-situ epitaxy, producing the MOSFET 100".

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A MOSFET, comprising:
   a semiconductor substrate formed of a first material;
   a gate on a free surface of the substrate, the gate including
      a gate dielectric, which comprises a layer of a high-k material on the free surface of the substrate, and a gate electrode on a free surface of the high-k layer, the high-k layer protruding beyond the gate electrode;
   a deep source and a deep drain formed of a second material on opposite sides of the gate, defining a stressed channel region, the source and the drain formed of a compound semiconductor material; and a shallow source extension and a shallow drain extension each formed by selective in-situ doped epitaxy of a third material;

wherein the first material is different from the third material.

2. The MOSFET of claim 1, wherein the semiconductor substrate comprises silicon, germanium, silicon-germanium, a compound semiconductor, strained silicon, strained silicon-germanium, a strained semiconductor, a strained compound semiconductor, silicon-on-insulator, germanium-on-insulator, silicon-germanium-on-insulator, a semiconductor-on-insulator, or a compound semiconductor-on-insulator.

3. The MOSFET of claim 1, wherein a dielectric constant of the high-k material is more than about 3.9.

4. The MOSFET of claim 1, wherein a buffer interface layer is interposed between the gate dielectric and the free surface of the substrate.

5. The MOSFET of claim 1, wherein the high-k layer is a protective and etching barrier for the gate electrode against the deleterious effects thereon of selective in-situ doped epitaxy, HF dip, cleaning, wet etching, or dry etching.

6. The MOSFET of claim 1, wherein the material of the high-k gate dielectric is selected from the group consisting of metal oxides, metal nitrides, metal silicates, transition metal oxides, transition metal nitrides, transition metal silicates, oxynitrides of metals, metal aluminates, zirconium silicate, zirconium aluminate, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof.

7. The MOSFET of claim 1, wherein the gate electrode comprises poly-silicon, poly-silicon-germanium, a metal, a metal-nitride, or a silicide.

8. The MOSFET of claim 1, wherein the source and the drain are formed by selective in-situ doped epitaxy.

9. The MOSFET of claim 8, wherein the second material is different from the first material.

10. The MOSFET of claim 1, wherein uppermost surfaces of the source and the drain are generally coplanar with an upper surface of the substrate.

11. The MOSFET of claim 1, wherein uppermost surfaces of the source and the drain are elevated above an upper surface of the substrate.

12. The MOSFET of claim 1, wherein termini of the shallow extensions are beneath peripheral portions of the gate electrode.

13. The MOSFET of claim 1, wherein the source and the drain are formed by selective in-situ doped epitaxy and comprises doped silicon, silicon-germanium, silicon-carbon, or a compound semiconductor.

14. A MOSFET, comprising:
a semiconductor substrate formed of a first material;
a gate on a free surface of the substrate, the gate including a gate dielectric, which comprises a layer of high-k material on the free surface of the substrate, and a gate electrode on a free surface of the high-k layer, the high-k layer protruding beyond the gate electrode and being capable of acting as a protective barrier against damage during etching, cleaning, epitaxial procedures, or epitaxial-related procedures;

a deep source and a deep drain formed of a second material on opposite sides of the gate, defining a stressed channel region, the source and the drain formed of a compound semiconductor material; and a shallow source extension and a shallow drain extension formed by selective in-situ doped epitaxy of a third material;

wherein the first material is different from the third material.

15. The MOSFET of claim 14, wherein the semiconductor substrate comprises silicon, germanium, silicon-germanium, a compound semiconductor, strained silicon, strained silicon-germanium, a strained semiconductor, a strained compound semiconductor, silicon-on-insulator, germanium-on-insulator, silicon-germanium-on-insulator, a semiconductor-on-insulator, or a compound semiconductor-on-insulator.

16. The MOSFET of claim 14, wherein the dielectric constant of the high-k material is higher than about 3.9.

17. The MOSFET of claim 14, wherein a buffer interface layer is interposed between the high-k material and the free surface of the substrate.

18. The MOSFET of claim 14, wherein the material of the high-k gate dielectric layer is selected from the group consisting of metal oxides, metal nitrides, metal silicates, transition metal oxides, transition metal nitrides, transition metal silicates, oxynitrides of metals, metal aluminates, zirconium silicate, zirconium aluminate, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof.

19. The MOSFET of claim 14, wherein the gate electrode comprises poly-silicon, poly-silicon-germanium, a metal, a metal nitride, or a silicide.

20. The MOSFET of claim 14, wherein the source and the drain are formed by selective in-situ epitaxy.

21. The MOSFET of claim 14, wherein uppermost surfaces of the source and the drain are generally coplanar with an upper surface of the substrate.

22. The MOSFET of claim 14, wherein uppermost surfaces of the source and the drain are elevated above an upper surface of the substrate.

23. The MOSFET of claim 14, wherein termini of the shallow extensions are beneath peripheral portions of the gate electrode.

24. The MOSFET of claim 14, wherein the extensions comprise doped silicon, silicon-germanium, silicon-carbon, or a compound semiconductor.

* * * * *